United States Patent [19]
Yonezawa et al.

[11] Patent Number: 6,037,589
[45] Date of Patent: Mar. 14, 2000

[54] ELECTRON BEAM DEVICE

[75] Inventors: Akira Yonezawa; Mitsuyoshi Sato; Osamu Takaoka, all of Chiba, Japan

[73] Assignee: Seiko Instruments Inc., Japan

[21] Appl. No.: 09/008,161

[22] Filed: Jan. 16, 1998

[30] Foreign Application Priority Data

| Jan. 16, 1997 | [JP] | Japan | 9-005731 |
| Jul. 1, 1997 | [JP] | Japan | 9-176237 |

[51] Int. Cl.$^7$ .................................................. H01J 37/244
[52] U.S. Cl. ........................................................... 250/310
[58] Field of Search ................................ 250/310, 396 R, 250/396 ML

[56] References Cited

U.S. PATENT DOCUMENTS

| 5,387,793 | 2/1995 | Sato et al. | 250/310 |
| 5,668,372 | 9/1997 | Iwabuchi et al. | 250/310 |
| 5,670,782 | 9/1997 | Sato | 250/310 |
| 5,677,530 | 10/1997 | Sato et al. | 250/310 |

*Primary Examiner*—Kiet T. Nguyen
*Attorney, Agent, or Firm*—Adams & Wilks

[57] ABSTRACT

An high resolution electron beam observation instrument has an electron beam source, an electron beam optical system for converging the electron beam and scanning the electron beam across the surface of a sample, and a compound magnetic and electrostatic objective lens comprising a single pole magnetic lens having a single magnetic pole portion disposed between the electron beam source and the sample and an electrostatic immersion lens, the electrostatic immersion lens comprising an upper electrode and a lower electrode, one end of the upper electrode extending between the single magnetic pole portion and the sample, and the lower electrode being disposed between the upper electrode and the sample; wherein a deceleration electric field is generated between the upper electrode and the lower electrode to allow high resolution observation of the sample. The upper electrode may comprise the single magnetic pole portion of the single pole magnetic lens, or one or more seperate electrodes. The single pole magnetic lens has a conical shaped portion extending between the single magnetic pole portion and the electron beam source. A potential applied to the sample differs from a potential applied to the lower electrode when the sample is not inclined and a difference between the potentials of the sample and the lower electrode is reduced, or the potentials are made equal to each other when the sample is inclined by the sample inclining means.

20 Claims, 6 Drawing Sheets

ELECTRON BEAM DEVICE

BACKGROUND OF THE INVENTION

The present invention relates to an electron beam instrument capable of carrying out high resolution observation at a low acceleration voltage.

In recent years, there is high demand for carrying out high resolution observation at a low acceleration voltage of around 1 kV particularly in observing a semiconductor by use of an SEM (Scanning Electron Microscope).

There has been proposed a method of using a single pole magnetic objective lens as a method of reducing aberration of an objective lens for high resolution observation. Particularly, there has been proposed a method of using a single pole magnetic objective lens wherein a single pole portion is formed in a conical shape and a peripheral magnetic pole portion is retrogressed from a top face of the single pole as disclosed in Japanese Patent Publication No. JP-A-3-1432 (U.S. Pat. No. 5,023,457) (FIG. 4) for carrying out high resolution observation by inclining a wafer at a large angle. When a distance between the top face of the single pole and a sample (working distance: WD) is reduced by the lens, the chromatic aberration coefficient Cc which is a dominant factor in respect of resolution at low acceleration voltage, can be reduced, however, lens exciting current is increased or, image distortion is enhanced. Particularly, when a wafer is inclined by a large angle, image distortion is not caused since the working distance WD is necessarily increased, however, it is difficult to reduce the value of the chromatic aberration coefficient Cc. In the actual case, when the working distance WD is about 15 mm by which the wafer can be inclined by 60°, the value of the chromatic aberration coefficient Cc is about 10 mm and resolution of about 10 nm can be provided with an acceleration voltage of 1 kV.

Figure 5:
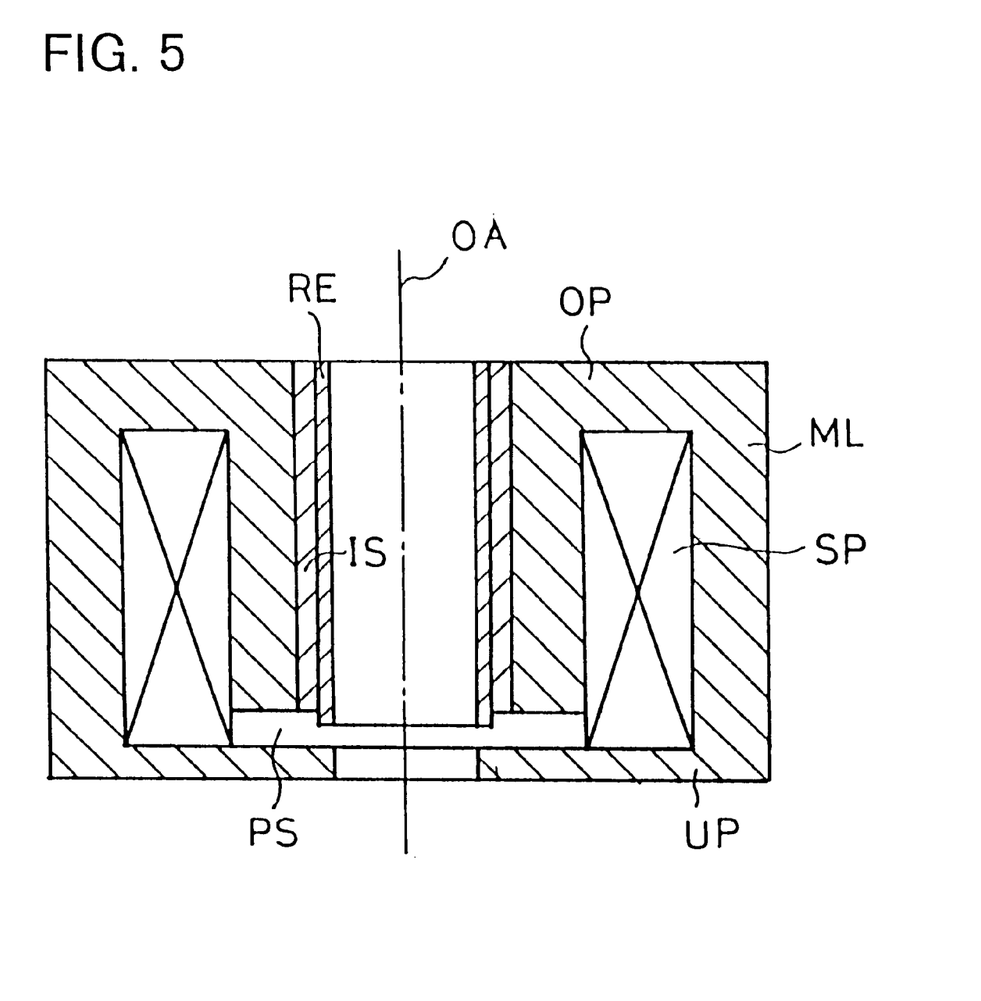
FIG. 5 is an explanatory view of a conventional example.

As another method of reducing aberration of the objective lens at a low acceleration voltage, as disclosed in Japanese Examined Patent Publication No. JP-B-6-24106 FIG. 5, there has been proposed a method of using "a static electromagnetic composite lens of a corpuscular beam instrument characterized in that in a static electromagnetic composite lens comprising a magnetic lens (ML) for generating a substantially rotationally symmetrical magnetic field and an electrostatic immersion lens for generating a substantially rotationally symmetric electric field where the electrostatic immersion lens is provided with two electrodes (RE, UP) at different potentials, wherein the both electrodes are provided symmetrical in respect of an axis of symmetry (OA) thereof inside of the magnetic lens (ML) and one magnetic pole piece (UP) of the magnetic lens (ML) forms one electrode of the electrostatic immersion lens. According to this method, chromatic aberration is reduced by providing a deceleration electric field between the two electrodes RE and UP forming the electrostatic immersion lens. However, in respect of the chromatic aberration coefficient Cc, in order to reduce the value down to ⅕ or smaller of the chromatic aberration coefficient Cc in the case where no potential is applied on the electrode RE, it is necessary to apply a potential of 10 kV or higher on the electrode RE at an acceleration voltage of about 1 kV and, in that case, electric discharge may be caused. Particularly, when the distance (WD) between the lower magnetic pole piece UP and the sample is reduced as much as possible and the magnetic pole piece UP is formed in a conical shape in order to observe the wafer by inclining the wafer by a large angle of about 60°, the distance between the electrode RE and the magnetic pole piece UP is reduced and the problem of electric discharge becomes more serious. It is actually extremely difficult to provide a chromatic aberration coefficient Cc as small as about 2 mm without causing electric discharge in a lens having a magnetic pole piece UP having a conical shape with inclination of 60°.

Figure 6:
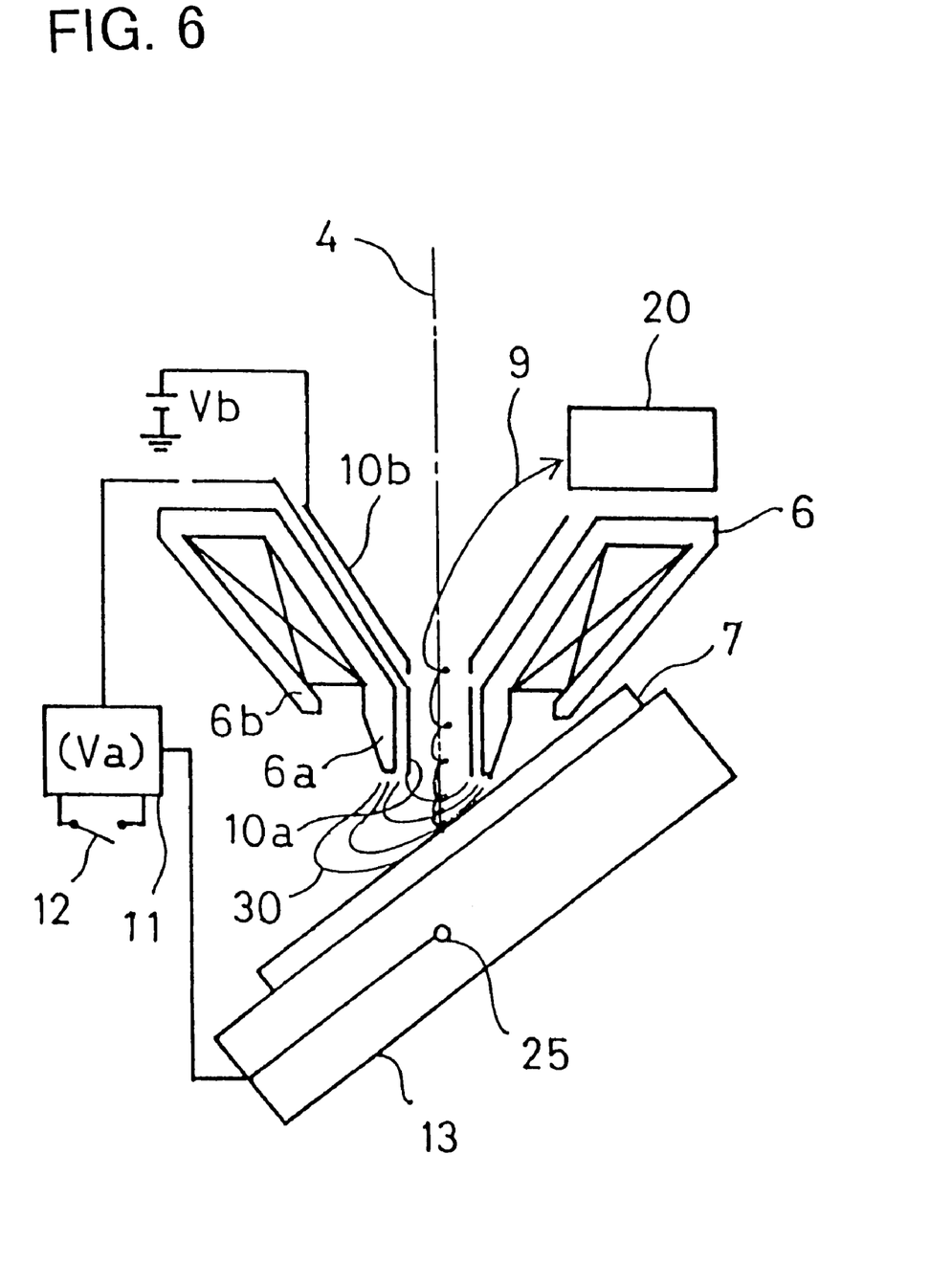
FIG. 6 is an explanatory view of a conventional example.

Further, there has been proposed a method in which the above-described two methods are used, as disclosed in Japanese Unexamined Patent Publication No. JP-A-8-185823 (FIG. 6). In this example, an electrostatic immersion lens is formed by an electrode 10a and a sample 7. When the sample is horizontal, a potential is applied to the electrode 10a. When the sample is inclined, the potential of the electrode 10a is reduced or cut off, which an increase in axial failure or astigmatism caused by a nonsymmetrical electric field is prevented. However, excellent resolution cannot be provided when the sample is inclined by a large angle since a deceleration electric field is not formed.

It is an object of the present invention to achieve higher resolution in observation by SEM at low acceleration voltage of about 1 kV, particularly, to observe the surface of a wafer by SEM at high resolution in inclining the wafer by a large angle.

SUMMARY OF THE INVENTION

In order to resolve the above-described problem the following instrument is provided.

1) According to a first aspect of the present invention, there is provided an electron beam instrument comprising a compound magnetic and electrostatic objective lens which is a compound lens comprising a single pole magnetic field type lens having a top face of a single magnetic pole disposed between an electron beam source and a sample and an electrostatic immersion lens wherein a portion of an upper electrode U of the electrostatic immersion lens is disposed inside of a yoke forming the top face of the single pole, one end of the upper electrode U is disposed between a vicinity of the top face of the single pole and the sample and a lower electrode B is disposed between the upper electrode U and the sample.

2) According to a second aspect of the present invention, there is provided an electron beam instrument comprising a compound magnetic and electrostatic objective lens which is a compound lens comprising a single pole magnetic field type lens having a top face of a single magnetic pole disposed between an electron beam source and a sample and an electrostatic immersion lens, wherein one end portion of an upper electrode of the electrostatic immersion lens constitutes the top face of the single pole and a lower electrode is disposed between the top face of the single magnetic pole and the sample.

3) In the instrument constructed according to of the first aspect or the second aspect, the lower electrode preferably comprises a plurality of electrodes.

4) According to another aspect of the present invention, the single pole portion of the single pole magnetic lens constituting the electromagnetic compound objective lens is formed in a conical shape and a peripheral magnetic pole end face is arranged from the face of the single pole to a side of the electron beam source.

5) According to another aspect of the present invention, when the sample is not inclined, a potential of the sample differs from a potential of the lower electrode opposed to the sample and when the sample is inclined, a difference between the potentials of the sample and the lower electrode is reduced or the potentials are made equal to each other.

Figure 1:
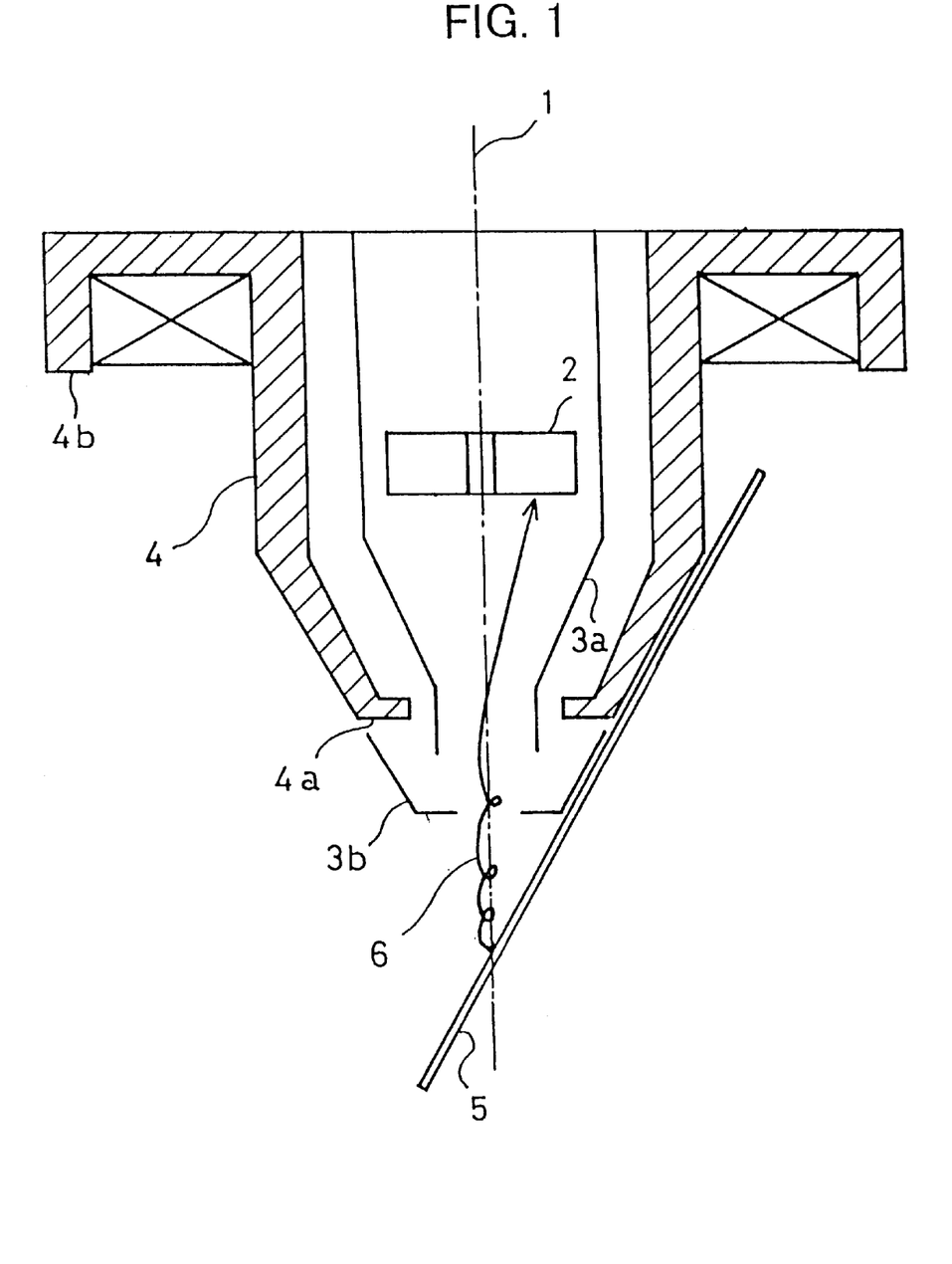
FIG. 1 is an explanatory view of an embodiment according to the present invention.

As illustrated in FIG. 1, an electron beam accelerated at several kV through 1 kV is further accelerated by the potential of 10 kV of an electrode 3a of one of a pair of electrostatic immersion lenses, and is converged by a magnetic field of a single pole magnetic lens having a maximum value at a vicinity of a top face of a magnetic pole and is then decelerated again to 1 kV by a deceleration electric field formed by a potential of an electrode 3b of the other of the pair of electrostatic immersion lenses and a potential of a sample 5 and is converged and irradiated onto the sample.

Figure 2:
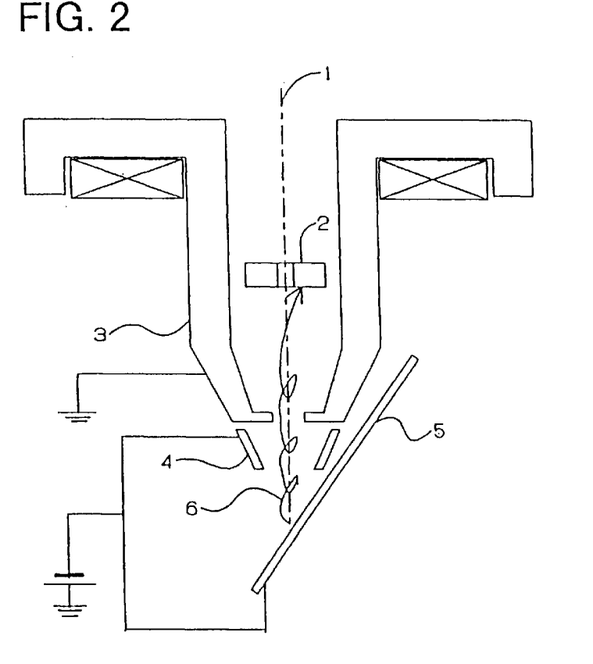
FIG. 2 is an explanatory view of another embodiment according to the present invention.
Figure 3:
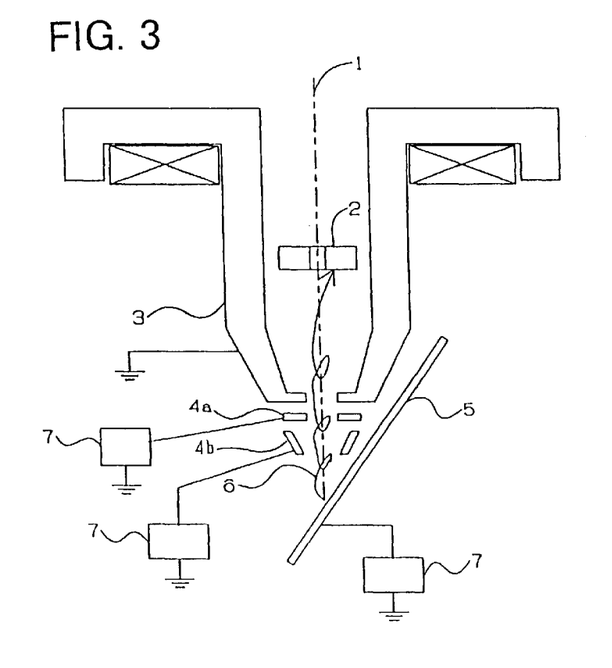
FIG. 3 is an explanatory view of still other embodiment according to the present invention.

As illustrated in FIG. 2 and FIG. 3, an electron beam accelerated by a comparatively high acceleration voltage of about several kV, is decelerated to about 1 kV by a deceleration electric field formed by the ground potential of the top face of the single electrode and negative potential of several kV applied to the electrode and the sample, and is converged and irradiated onto the sample. Secondary electrons generated by the irradiation of the electron probe are detected by a secondary electron detector provided above the sample by which an image is formed. When potentials of the sample and the electrode opposed thereto are set to the same potential in any of the above-described cases, even if the sample is inclined, astigmatic aberration is not caused by generating nonsymmetrical electric field.

Figure 4:
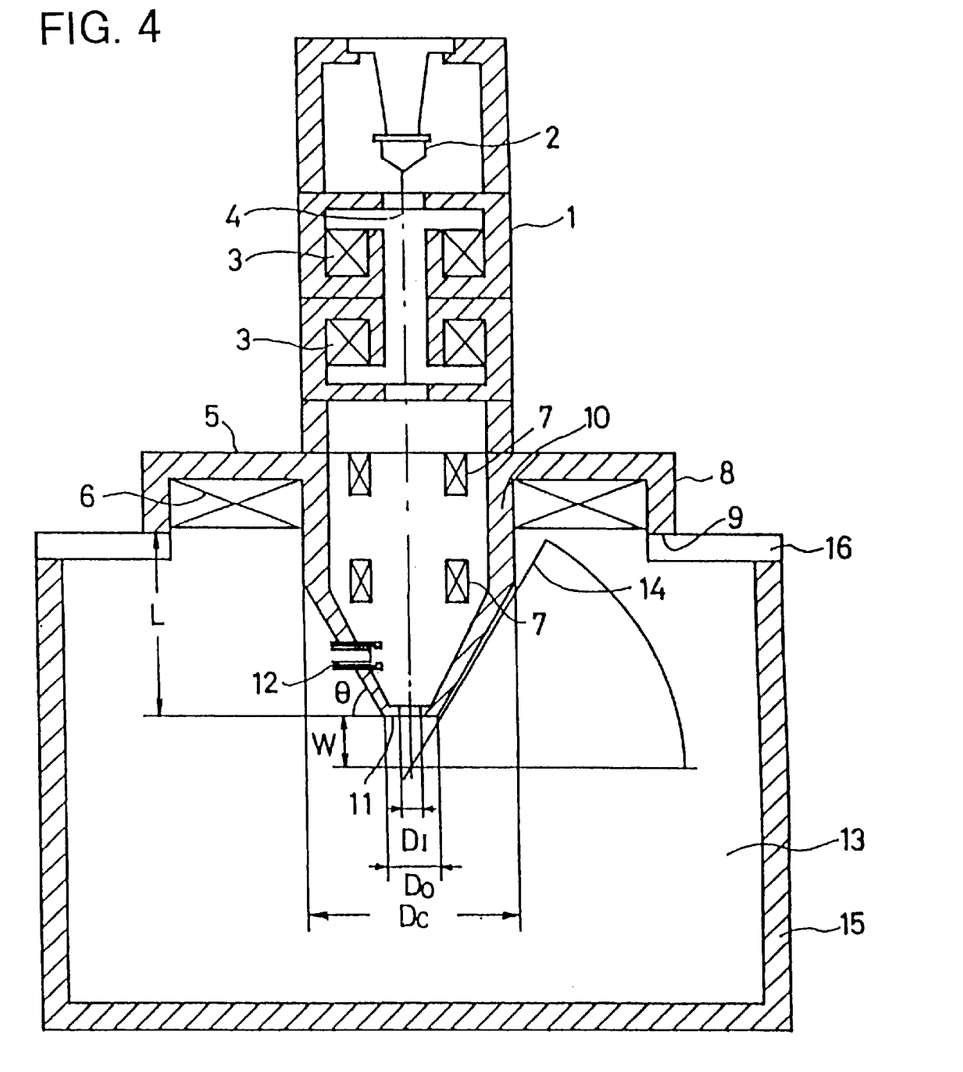
FIG. 4 is an explanatory view of a conventional example.
Figure 7:
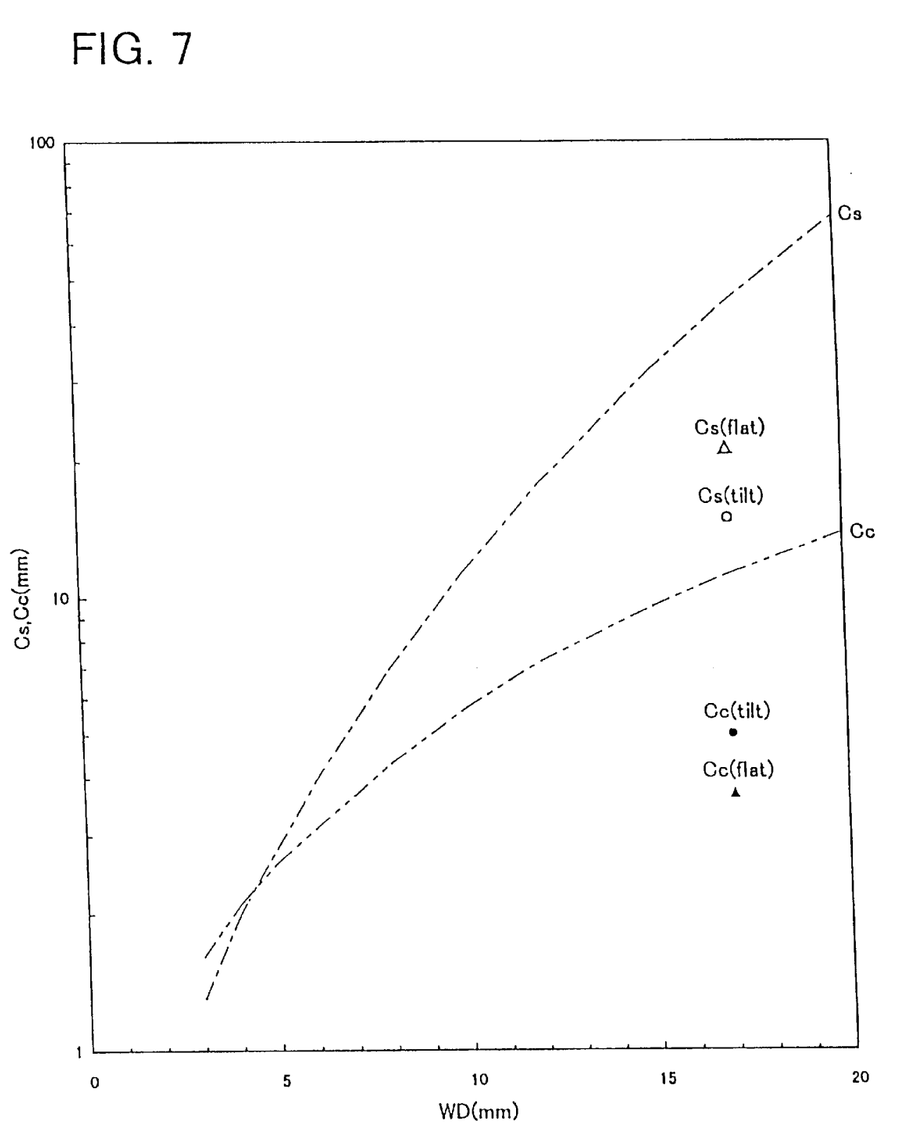
FIG. 7 is a diagram showing examples of values of aberration coefficients.

FIG. 7 shows an example comparing calculations results of aberration coefficients of the present invention (FIG. 3) and a conventional example (FIG. 4). The chromatic aberration coefficient Cc considerably contributing to the resolution at low acceleration voltage with a comparatively long working distance (17 mm) whereby the wafer can be inclined by a large angle, is about 10 mm in the case of the conventional example (designated by two-dotted chain line in FIG. 7). According to the present invention (FIG. 3), the chromatic aberration coefficient is designated by notation Cc (tilt) (FIG. 7) in correspondence with the case where the wafer is inclined. It is known that the chromatic aberration coefficient Cc is reduced to approximately ½ when the upper side electrode 4a is grounded and the lower side electrode 4b is provided with a bias voltage (−2 kV) the same as that of the sample 5 and the chromatic aberration coefficient is reduced to about ⅓ in correspondence with the case where the wafer is horizontal (which is designated by notation Cc (flat) in FIG. 7 when both of the upper side electrode 4a and the lower side electrode 4b are grounded and the sample is applied with a bias voltage of −2 kV).

Accordingly, high resolution observation can be carried out even with a comparatively large working distance WD by which the sample can be inclined by a large angle.

DETAILED DESCRIPTION OF THE PREFERRED EMBODIMENTS

FIG. 1 shows a first embodiment of the present invention. A primary electron beam 1 emitted from an electron gun is accelerated at, for example, 1 kV, passes through a hole provided in an axisymmetric secondary electron detector 2, is further accelerated by a potential of 10 kV by an upper side electrode 3a of an electrostatic immersion lens, converged by a static magnetic field formed in the lower direction from a top face 4a of a single pole magnetic lens 4 having a maximum value at a vicinity of the top face 4a, decelerated again to 1 kV by the ground potential of a lower side electrode 3b of the electrostatic immersion lens, and is thereafter irradiated onto a wafer 5 to serve as an electron beam probe. The electron beam probe is made to scan the surface of the wafer by a scanning deflection coil which is not illustrated in FIG. 1, and a generated secondary electron beam 6 is converged by the single pole lens magnetic field, accelerated by the electric field of the electrostatic immersion lens 3a, 3b and is detected by the secondary electron detector 2.

The chromatic aberration coefficient Cc of about 3 mm or lower can be provided with a comparatively large working distance WD by the strong magnetic field of the single pole lens and the deceleration electric field and high resolution observation having a resolution of about 4 nm or smaller can be carried out with the acceleration voltage of 1 kV in a state where the wafer is inclined by a large angle.

The secondary electron detector 2 may comprise an axisymmetric scintillator or a micro channel plate and the potential is set to be equal to that of the upper side electrode 3a. Although the potential of the upper side electrode 3a of the electrostatic immersion lens may be changed in proportion to the acceleration voltage, the potential is set to about 10 kV or lower in view of the problem of electric discharge.

When the potential of the wafer 5 is set to the ground potential the same as the potential of the lower side electrode 3b, astigmatic aberration is not increased since a nonsymmetrical electric field is not caused even in the case where the wafer 5 is inclined by a large angle. Therefore, it is not necessary to cut off the potential of the upper side electrode 3a in cooperation with the inclination of the sample and high resolution is maintained even when the sample is inclined.

According to the example of FIG. 5, a lower side electrode UP of the electrostatic immersion lens constitutes a magnetic pole piece and a pertinent thickness is needed to prevent magnetic saturation. Accordingly, when the lower side electrode UP is formed in a conical shape to observe the wafer by inclining the wafer by a large angle of about 60°, the distance between the electrode UP and the electrode RE is reduced and electric discharge is apt to result. According to the present invention, the thickness of the lower side electrode 3b can be made extremely small and therefore, the distance between the upper side electrode 3a and the lower side electrode 3b can be made comparatively large and application of high voltage is facilitated.

Further, negative potential may be applied to the wafer 5 in the device of FIG. 1. When negative potential is applied to the wafer 5, the effect of the deceleration electric field is further enhanced and the aberration coefficient can further be reduced. This is effective in the case where the potential applied to the electrode UP is limited due to the problem of electric discharge. Further, an effect of increasing secondary electrons to be detected is achieved. In this case, when the wafer is inclined, the astigmatic aberration is increased by the nonsymmetrical electric field caused by the inclination and therefore, the potential of the wafer is cut off to the ground potential in cooperation with the inclination of the sample. Or, negative potential is applied on the lower side electrode 3b in a state where negative potential is applied on the wafer 5 by which the potential of the lower side electrode 3b is made equal to that of the wafer 5. As a result, the nonsymmetrical potential distribution as shown in the example of FIG. 6 is not caused and an increase in the astigmatic aberration can be avoided.

FIG. 2 shows another embodiment of the present invention. In this embodiment, the upper electrode 3a is dispensed with in the embodiment of FIG. 1 and an upper electrode end portion is formed at the top face of the single pole lens (ground potential) in place thereof. The electron beam is converged onto the wafer by the strong magnetic field of the single pole lens and the deceleration electric field formed by the single pole top face and the lower electrode.

The primary electron beam 1 emitted from an electron source is accelerated to 3 kV, passes through a hole provided at the axisymmetric secondary electron detector 2, and is thereafter converged by the magnetic field of the single pole magnetic field type lens 3. Further, the electron beam is decelerated to about 1 kV by the deceleration electric field formed by negative bias voltage of about 2 kV of the electrode 4 formed in a conical shape such that a hazard due of the inclination of the sample is not caused, and the ground potential of the magnetic field and at the same time, converged and irradiated onto the wafer 5. The converged electron beam is made to scan the surface of the wafer by a deflection coil not illustrated in FIG. 2 and the generated secondary electron beam 6 is guided efficiently to the secondary electron detector installed above by superposing operation of the magnetic field of the single pole lens and the electric field between the magnetic pole and the electric pole whereby secondary electron image is formed. The secondary electron detector 2 comprises a scintillator or a micro channel plate. The wafer 5 and the electrode 4 are provided with the same potential and therefore, high resolution observation can be carried out without causing a nonsymmetric electric field by the inclination, without changing nonsymmetricity by the angle of the inclination and without causing an increase in astigmatic aberration even when the wafer is inclined.

When the sample is not inclined, by setting the potential of the electrode 4 to the ground potential, the above-described deceleration electric field is formed at a vicinity of the wafer 5 and therefore, the superposing effect of the electric field and the magnetic field is operated further efficiently and higher resolution observation can be carried out.

FIG. 3 shows another embodiment of the present invention. An electrode which is formed in a conical shape such that a hazard due to inclining of the wafer 5 is not caused, is formed by the upper electrode 4a and the lower electrode 4b and voltage is controlled along with the wafer 5 by which a range of application is widened.

In FIG. 3:

1) When the upper electrode 4a is set to the ground potential and the lower electrode 4b is set to negative potential the same as that of the wafer 5, compared with the constitution of FIG. 2, the observation can be carried out with higher resolution even when the wafer is inclined by an amount which causes the main face of the electrostatic lens to approach the wafer 5.

2) When the wafer 5 is not inclined, if both of the upper electrode 4a and the lower electrode 4b are set to the ground potential and a negative bias voltage is applied only to the wafer 5, high resolution observation equivalent to observation with a short working distance as in the case of FIG. 2 can be carried out.

3) When an einzel lens is formed by setting all of the magnetic pole, the lower electrode 4b and the wafer 5 at ground potential and applying a positive voltage to the upper electrode 4a, not only is the aberration coefficient reduced by the superposing operation of the electric field and the magnetic field but a nonsymmetric electric field is not caused and deterioration in an observed image is caused by astigmatic aberration even if the wafer is inclined since the wafer 5 and the lower electrode 4b are provided with the same potential. Furthermore, even when the wafer 5 is made to approach the magnetic pole by inclining the wafer 5 by a large angle, there is no concern of causing electric discharge since the magnetic pole and the wafer are provided with the same potential.

As explained above, the present invention achieves the effect of providing high resolution of about 4 nm or smaller with a comparatively large working distance WD by which a sample such as a wafer can be inclined by a large angle at an acceleration voltage of 1 kV, which could not be obtained by the conventional instrument with the same working distance WD.

According to the examples of FIG. 2 and FIG. 3, the value of the chromatic aberration coefficient Cc is apt to be larger than that of the example of FIG. 1, however, an effect of simplifying the construction and the electro-optical constitution is achieved.

Further, although in FIG. 1 through FIG. 3, the examples of applying the present invention to the single pole magnetic field type lens where the single pole portion is formed in a conical shape and the peripheral magnetic pole face is arranged from the single pole face to the side of the electron source, have been shown, the present invention may be applied to a single pole magnetic field type lens where a peripheral magnetic pole face is disposed at a face substantially the same as the single pole face.

What is claimed is:

1. In an electron beam observation instrument, a compound magnetic and electrostatic objective lens comprising: a single pole magnetic lens having a top face with a single magnetic pole disposed between an electron beam source and a sample; and an electrostatic immersion lens comprising an upper electrode and a lower electrode, a substantial portion of the upper electrode of the electrostatic immersion lens is disposed inside a yoke forming the top face of the single pole magnetic lens, one end of the upper electrode is disposed between the top face of the single pole portion of the magnetic lens and the sample and a lower electrode of the electrostatic immersion lens is disposed between the upper electrode and the sample; wherein a deceleration electric field is generated between the upper electrode and the lower electrode, generation of an asymmetrical electric field is prevented and high resolution observation of the sample is allowed.

2. An electron beam instrument according to claim 1; wherein the lower electrode comprises a plurality of individual electrodes.

3. An electron beam instrument according to claim 1; wherein the single pole portion of the single pole magnetic lens constituting the electromagnetic compound objective lens is formed in a conical shape and a peripheral magnetic pole end face thereof extends from the single pole portion of the single pole magnetic lens to the electron beam source.

4. An electron beam instrument according to claim 3, further comprising potential applying means for selectively applying a potential to the lower electrode and the sample, and sample inclining means for inclining the sample, wherein a potential applied to the sample by the potential applying means differs from a potential applied to the lower electrode opposed to the sample by the potential applying means when the sample is not inclined and a difference between the potentials of the sample and the lower electrode is reduced by the potential applying means or the potentials are made equal to each other by the potential applying means when the sample is inclined by the sample inclining means.

5. In an electron beam instrument, a compound magnetic and electrostatic objective lens comprising: a single pole magnetic lens having a top face with a single magnetic pole disposed between an electron beam source and a sample; and an electrostatic immersion lens comprising an upper electrode and a lower electrode, one end portion of the upper electrode of the electrostatic immersion lens constitutes the top face of the single pole portion of the magnetic lens and the lower electrode is disposed between the top face of the single magnetic pole and the sample; wherein a deceleration electric field is generated between the upper electrode and the lower electrode, generation of an asymmetrical electric field is prevented and high resolution observation of the sample is allowed.

6. An electron beam instrument according to claim 5; wherein the lower electrode comprises a plurality of individual electrodes.

7. An electron beam instrument according to claim 5; wherein the single pole portion of the single pole magnetic lens constituting the electromagnetic compound objective lens is formed in a conical shape and a peripheral magnetic pole end face thereof extends from the single pole portion of the single pole magnetic lens to the electron beam source.

8. An electron beam instrument according to claim 7; further comprising potential applying means for selectively applying a potential to the lower electrode and the sample, and sample inclining means for inclining the sample, wherein a potential applied to the sample by the potential applying means differs from a potential applied to the lower electrode opposed to the sample by the potential applying means when the sample is not inclined and a difference between the potentials of the sample and the lower electrode is reduced by the potential applying means or the potentials are made equal to each other by the potential applying means when the sample is inclined by the sample inclining means.

9. An electron beam observation instrument comprising: an electron beam source; an electron beam optical system for converging the electron beam and scanning the electron beam across the surface of a sample; and a compound magnetic and electrostatic objective lens comprising a single pole magnetic lens having a single magnetic pole portion disposed between the electron beam source and the sample and an electrostatic immersion lens, the electrostatic immersion lens comprising an upper electrode and a lower electrode, one end of the upper electrode extending between the single magnetic pole portion and the sample, and the lower electrode being disposed between the upper electrode and the sample; wherein a deceleration electric field is generated between the upper electrode and the lower electrode, generation of an asymmetrical electric field is prevented and high resolution observation of the sample is allowed.

10. An electron beam observation instrument according to claim 9; wherein the upper electrode comprises the single magnetic pole portion of the single pole magnetic lens.

11. An electron beam observation instrument according to claim 9; wherein the single pole magnetic lens further comprises a conical shaped portion extending between the single magnetic pole portion and the electron beam source.

12. An electron beam observation instrument according to claim 9; wherein the lower electrode comprises a plurality of individual electrodes.

13. An electron beam observation instrument according to claim 9; further comprising potential applying means for selectively applying a potential to the lower electrode and the sample, and sample inclining means for inclining the sample, wherein a potential applied to the sample by the potential applying means differs from a potential applied to the lower electrode by the potential applying means when the sample is not inclined and a difference between the potentials of the sample and the lower electrode is reduced by the potential applying means or the potentials are made equal to each other by the potential applying means when the sample is inclined by the sample inclining means.

14. An electron beam observation instrument according to claim 13; wherein the sample comprises a wafer.

15. An electron beam observation instrument comprising: an electron beam source; an electron beam optical system for converging the electron beam and scanning the electron beam across the surface of a sample; a compound magnetic and electrostatic objective lens comprising a single pole magnetic lens having a single magnetic pole portion disposed between the electron beam source and the sample and an electrostatic immersion lens, the electrostatic immersion lens comprising an upper electrode and a lower electrode, one end of the upper electrode extending between the single magnetic pole portion and the sample, and the lower electrode being disposed between the upper electrode and the sample; potential applying means for selectively applying a potential to the lower electrode and the sample; and sample inclining means for inclining the sample, wherein a potential applied to the sample by the potential applying means differs from a potential applied to the lower electrode by the potential applying means when the sample is not inclined and a difference between the potentials of the sample and the lower electrode is reduced by the potential applying means or the potentials are made equal to each other by the potential applying means when the sample is inclined by the sample inclining means.

16. An electron beam observation instrument according to claim 15; wherein the upper electrode comprises the single magnetic pole portion of the single pole magnetic lens.

17. An electron beam observation instrument according to claim 15; wherein the single pole magnetic lens further comprises a conical shaped portion extending between the single magnetic pole portion and the electron beam source.

18. An electron beam observation instrument according to claim 15; wherein the lower electrode comprises a plurality of individual electrodes.

19. An electron beam observation instrument according to claim 15; further comprising a secondary electron detector disposed between the upper electrode and the electron beam source.

20. An electron beam observation instrument according to claim 19; wherein the potential applying means generates a deceleration electric field between the upper electrode and the lower electrode, generation of an asymmetrical electric field is prevented and high resolution observation of the sample is allowed.

* * * * *